United States Patent [19]

Kashiwaya et al.

[11] Patent Number: 5,668,071
[45] Date of Patent: Sep. 16, 1997

[54] PIEZOELECTRIC PORCELAIN

[75] Inventors: Toshikatsu Kashiwaya, Inazawa; Hirofumi Yamaguchi, Komaki; Tadashi Otagiri, Nagoya, all of Japan

[73] Assignee: NGK Insulators, Ltd., Japan

[21] Appl. No.: 604,712

[22] Filed: Feb. 21, 1996

[30] Foreign Application Priority Data

Feb. 22, 1995 [JP] Japan ................... 7-033467
Feb. 22, 1995 [JP] Japan ................... 7-033468
Mar. 2, 1995 [JP] Japan ................... 7-042967

[51] Int. Cl.$^6$ .................. C04B 35/472; C04B 35/499
[52] U.S. Cl. .................. 501/136; 501/137; 252/62.9 PZ
[58] Field of Search .................. 501/136, 137, 501/138, 139; 252/62.9 PZ

[56] References Cited

U.S. PATENT DOCUMENTS

| 4,940,681 | 7/1990 | Ushida et al. | 252/62.9 PZ |
| 5,275,988 | 1/1994 | Mori et al. | 501/136 |
| 5,500,142 | 3/1996 | Ushida et al. | 501/136 |
| 5,525,562 | 6/1996 | Kagata et al. | 501/136 |
| 5,527,481 | 6/1996 | Otsu et al. | 501/136 |

FOREIGN PATENT DOCUMENTS

| 3011521 | 1/1988 | Japan . |
| 3011522 | 1/1988 | Japan . |
| 3011523 | 1/1988 | Japan . |
| 3-40964 | 2/1991 | Japan ................. C04B 35/49 |

Primary Examiner—Karl Group
Attorney, Agent, or Firm—Parkhurst, Wendel & Burr, L.L.P.

[57] ABSTRACT

The present invention includes the following three types of piezoelectric porcelains. (1) In a piezoelectric porcelain having a composition of $aPb[Mg_{1-x}Ni_x)_{1/3}(Nb_{1-y}Ta_y)_{2/3}]O_3\text{-}bPbTiO_3\text{-}cPbZrO_3$, the coefficients a, b and c (mol %) and the substitution rate X satisfy all the following conditions; $15 \leq a \leq 45$, $32 \leq b \leq 45$, $10 \leq c \leq 50$ and $0.1 \leq X \leq 0.9$. (2) In a piezoelectric porcelain having a composition of $aPb[Mg_{1-x}Ni_x)_{1/3}(Nb_{1-y}Ta_y)_{2/3}]O_3\text{-}bPbTiO_3\text{-}cPbZrO_3$, the coefficients a, b and c (mol %) and the substitution rates X and Y satisfy all the following conditions; $15 \leq a \leq 45$, $32 \leq b \leq 45$, $10 \leq c \leq 50$, $0.1 \leq X \leq 0.9$, $0.1 \leq Y \leq 0.9$ and $Y\text{-}X \geq 0.05$. (3) In a piezoelectric porcelain having a composition of $aPb[Mg_{1-x}Ni_x)_{1/3}(Nb_{1-y}Ta_y)_{2/3}]O_3\text{-}bPbTiO_3\text{-}cPbZrO_3$, the coefficients a, b and c (mol %) and the substitution rates X and Y satisfy all the following conditions; $15 \leq a \leq 45$, $32 \leq b \leq 45$, $10 \leq c \leq 50$, $0.2 \leq X \leq 0.9$, $0.2 \leq Y \leq 0.9$ and $X\text{-}Y \geq 0.05$.

16 Claims, 4 Drawing Sheets

PIEZOELECTRIC PORCELAIN

BACKGROUND OF THE INVENTION

(1) Field of the Invention

The present invention relates to piezoelectric porcelains suitably for a member of a piezoelectric actuator, a piezoelectric buzzer and so on which utilize piezoelectric distortion.

(2) Related Art Statement

Lead zirconate titanate has a large piezoelectric distortion and can be used at a high temperature. Moreover, if a part of zirconate or titanate is substituted by the other elements, various kinds of properties can be obtained. Particularly, piezoelectric porcelains of three component series having a composition of $PbTiO_3\text{-}PbZrO_3\text{-}Pb(Mg_{1/3}Nb_{2/3})O_3$, in which a part of zirconate or titanate is substituted by magnesium and niobium, has a relatively large piezoelectric constant $d_{31}$.

Recently, in fields of precision machines, an optical instruments and so on, precise position control is needed. To this end, a piezoelectric element utilizing a piezoelectric distortion has been developed. As for such elements, a piezoelectric porcelain having a high piezoelectric constant $d_{31}$ is desired so as to make a distortion amount of the element larger. However, from the point of view mentioned above, a piezoelectric constant $d_{31}$ of the piezoelectric porcelain of three component series having a composition of $PbTiO_3\text{-}PbZrO_3\text{-}Pb(Mg_{1/3}Nb_{2/3})O_3$ mentioned above is $-225$ pm/V and thus it is not sufficient for this purpose.

Further, in Japanese Patent Laid-Open Publication No. 3-40964, it is disclosed that an excellent property such as a piezoelectric constant $d_{31}=-307.9$ pm/V can be realized in a piezoelectric porcelain of three component series having a composition of $Pb(Mg_{1/3}Nb_{2/3})_{0.225}(Ni_{1/3}Ta_{2/3})_{0.15}Ti_{0.375}Zr_{0.25}O_3$.

However, in the piezoelectric porcelain having the composition disclosed in Japanese Patent Laid-Open Publication No. 3-40964, a Curie point is 177° C. which is very low. If the Curie point of the piezoelectric porcelain is low in a piezoelectric element, a limit of temperature, to which the piezoelectric porcelain is driven, becomes low. That is to say, if a Curie point of the piezoelectric porcelain is low, the following disadvantages occur.

Generally, since a piezoelectric porcelain after firing shows no piezoelectricity, it is necessary to perform a poling thereto under applying a DC voltage. However, if the piezoelectric porcelain after the poling mentioned above is once used at a temperature above a Curie point, the piezoelectric porcelain shows no piezoelectricity again. Therefore, it is necessary to perform a poling again for the piezoelectric porcelain. In this manner, the piezoelectric porcelain having a composition of $Pb(Mg_{1/3}Nb_{2/3})O_3\text{-}Pb(Ni_{1/3}Ta_{2/3})O_3\text{-}PbTiO_3\text{-}PbZrO_3$ has a high piezoelectric property, but the use of the piezoelectric porcelain mentioned above is limited to low temperatures.

SUMMARY OF THE INVENTION

An object of the invention is to eliminate the drawbacks mentioned above, and to provide a piezoelectric porcelain of three component series in which a piezoelectric constant $d_{31}$ is improved.

According to a first aspect of the invention, piezoelectric porcelains have a composition of $aPb[Mg_{1/3}(Nb_{1-x}Ta_x)_{2/3}]O_3\text{-}bPbTiO_3\text{-}cPbZrO_3$, coefficients a, b and c being mol % and a+b+c=100, wherein said coefficients a, b and c and a value X satisfy following conditions (1)~(4);

$$15 \leq a \leq 45 \qquad (1)$$

$$32 \leq b \leq 45 \qquad (2)$$

$$10 \leq c \leq 50 \qquad (3)$$

$$0.1 \leq X \leq 0.9 \qquad (4).$$

Another object of the invention is to eliminate the drawbacks mentioned above, and to provide a piezoelectric porcelain in which a piezoelectric constant $d_{31}$ is improved and also a high Curie point can be maintained.

According to a second aspect of the invention, piezoelectric porcelains have a composition of $aPb[(Mg_{1-x}Ni_x)_{1/3}(Nb_{1-y}Ta_y)_{2/3}]O_3\text{-}bPbTiO_3\text{-}cPbZrO_3$, coefficients a, b and c being mol % and a+b+c=100, wherein said coefficients a, b and c and a value X satisfy following conditions (21)~(26);

$$15 \leq a \leq 45 \qquad (21)$$

$$32 \leq b \leq 45 \qquad (22)$$

$$10 \leq c \leq 50 \qquad (23)$$

$$0.1 \leq X \leq 0.9 \qquad (24)$$

$$0.1 \leq Y \leq 0.9 \qquad (25)$$

$$Y-X \geq 0.05 \qquad (26).$$

According to a third aspect of the invention, piezoelectric porcelains have a composition of $aPb[(Mg_{1-x}Ni_x)_{1/3}(Nb_{1-y}Ta_y)_{2/3}]O_3\text{-}bPbTiO_3\text{-}cPbZrO_3$, coefficients a, b and c being mol % and a+b+c=100, wherein said coefficients a, b and c and a value X satisfy following conditions (41)~(46);

$$15 \leq a \leq 45 \qquad (41)$$

$$32 \leq b \leq 45 \qquad (42)$$

$$10 \leq c \leq 50 \qquad (43)$$

$$0.2 \leq X \leq 0.9 \qquad (44)$$

$$0.2 \leq Y \leq 0.9 \qquad (45)$$

$$X-Y \geq 0.05 \qquad (46).$$

In the first aspect of the invention, the present inventors find that, in a piezoelectric porcelain having a composition of $PbTiO_3\text{-}PbZrO_3\text{-}Pb(Mg_{1/3}Nb_{2/3})O_3$, a relative dielectric constant of the piezoelectric porcelain is improved and a piezoelectric constant $d_{31}$ of the piezoelectric porcelain is improved extra-ordinarily by substituting a part of niobium by tantalum.

In this case, if a substitution rate X of tantalum with respect to niobium is not larger than 0.1, an effect of tantalum substitution does not appear so much. Moreover, if a value X is not smaller than 0.9, a Curie point of the piezoelectric porcelain decreases.

Further, if the value X is increased, a piezoelectric constant $d_{31}$ of the piezoelectric porcelain is improved gradually. Particularly, if the value X is larger than 0.3, it is effective for an improvement of the piezoelectric constant $d_{31}$. Moreover, it is confirmed that, if the value X is smaller than 0.8, a Curie point of the piezoelectric porcelain becomes higher gradually. On this case, it is preferred that the coefficients a, b and c and the value X satisfy the following in equations (5)~(8);

$$25 \leq a \leq 43 \qquad (5)$$

$$35 \leq b \leq 43 \qquad (6)$$

$$14 \leq c \leq 40 \quad (7)$$

$$0.3 \leq X \leq 0.8 \quad (8).$$

Furthermore, from the view point mentioned above, it is further effective if the value X is larger than 0.4, and a piezoelectric constant $d_{31}$ is most improved if the value X is near 0.6. However, if the value X is not larger than 0.7, a decrease of a Curie point becomes larger. Therefore, in this case, it is further preferred that the coefficients a, b and c and the value X satisfy the following conditions (9)~(12);

$$30 \leq a \leq 42 \quad (9)$$

$$37 \leq b \leq 40 \quad (10)$$

$$18 \leq c \leq 33 \quad (11)$$

$$0.4 \leq X \leq 0.6 \quad (12).$$

Moreover, if up to 10 atomic % of Pb is substituted by one or more metal elements selected from a group of strontium, calcium and barium, it is possible to improve a piezoelectric constant $d_{31}$ more. If a substitution rate of the metal elements is larger than 3 atomic %, a piezoelectric constant $d_{31}$ is most improved. From this view point, it is further preferred if the substitution rate is larger than 4 atomic %. However, if the substitution rate is not smaller than 8 atomic %, a Curie point of a piezoelectric porcelain is decreased gradually. Therefore, it is preferred that the substitution rate is smaller than 8 atomic % and it is further preferred that the substitution rate is smaller than 7 atomic %.

In the second aspect of the invention, the present inventors find that, in a piezoelectric porcelain having a composition of $Pb(Mg_{1/3}Nb_{2/3})O_3$-$Pb(Ni_{1/3}Ta_{2/3})O_3$-$PbTiO_3$-$PbZrO_3$, both of a piezoelectric constant $d_{31}$ and a Curie point of the piezoelectric porcelain are improved by substituting a part of magnesium by nickel and by substituting a part of niobium by tantalum simultaneously.

In this case, if values X and Y satisfy Y-X$\geq$0.05, a Curie point of the piezoelectric porcelain is improved, and also the piezoelectric porcelain having a particularly large piezoelectric constant $d_{31}$ can be obtained.

In this case, if the values X and Y become larger, a Curie point of the piezoelectric porcelain is decreased generally, and a piezoelectric constant $d_{31}$ thereof is improved. In addition, a piezoelectric constant $d_{31}$ becomes larger if the values X and Y are in a range of 0.3~0.9, and it becomes even larger if the values X and Y are in a range of 0.4~0.8. However, if the values X and Y are not smaller than 0.9, a Curie point is decreased abruptly. From the view point of a Curie point, it is preferred that the values X and Y are smaller than 0.8, and it is further preferred that the values of X and Y are smaller than 0.6.

Therefore, it is preferred that the coefficients a, b and c and the values X and Y satisfy the following in equations (27)~(31);

$$25 \leq a \leq 43 \quad (27)$$

$$35 \leq b \leq 43 \quad (28)$$

$$14 \leq c \leq 40 \quad (29)$$

$$0.3 \leq X \leq 0.8 \quad (30)$$

$$0.3 \leq Y \leq 0.8 \quad (31).$$

Moreover, it is further preferred that the coefficients a, b and c and the values X and Y satisfy the following in equations (32)~(36);

$$30 \leq a \leq 42 \quad (32)$$

$$37 \leq b \leq 40 \quad (33)$$

$$18 \leq c \leq 33 \quad (34)$$

$$0.4 \leq X \leq 0.6 \quad (35)$$

$$0.4 \leq Y \leq 0.6 \quad (36).$$

Further, it is necessary to set a difference between X and Y larger than 0.05. In this case, it is preferred to set the difference larger than 0.1 so as to increase a piezoelectric constant $d_{31}$. Moreover, from the point of view of preventing a decrease of a Curie point, it is further preferred to set the difference smaller than 0.4.

Furthermore, if up to 10 atomic % of Pb is substituted by one or more elements selected from a group of strontium, calcium and barium, it is possible to improve a piezoelectric constant $d_{31}$ more. If a substitution rate of the metal elements is larger than 3 atomic %, a piezoelectric constant $d_{31}$ is most improved. From this point of view, it is further preferred if the substitution rate is larger than 4 atomic %. However, if the substitution rate is not smaller than 8 atomic %, a Curie point of a piezoelectric porcelain is decreased gradually. Therefore, it is preferred that the substitution rate is smaller than 8 atomic % and it is further preferred that the substitution rate is smaller than 7 atomic %.

In the third aspect of the invention, the present inventors find that, in a piezoelectric porcelain having a composition of $Pb(Mg_{1/3}Nb_{2/3})O_3$-$Pb(Ni_{1/3}Ta_{2/3})O_3$-$pbTiO_3$-$PbZrO_3$, both of a piezoelectric constant $d_{31}$ and a Curie point of the piezoelectric porcelain are improved by substituting a part of magnesium by nickel and by substituting a part of niobium by tantalum simultaneously.

In this case, if values X and Y satisfy X-Y$\geq$0.05, a Curie point of the piezoelectric porcelain is improved, and also the piezoelectric porcelain having a particularly large piezoelectric constant $d_{31}$ can be obtained.

In this case, if the values X and Y become larger, a Curie point of the piezoelectric porcelain is decreased generally, and a piezoelectric constant $d_{31}$ thereof is improved. In addition, a piezoelectric constant $d_{31}$ becomes larger if the values X and Y are in a range of 0.3~0.9, and it becomes even larger if the values X and Y are in a range of 0.4~0.8. However, if the values X and Y are not smaller than 0.9, a Curie point is decreased abruptly. From the view point of a Curie point, it is preferred that the values X and Y are smaller than 0.8, and it is further preferred that the values of X and Y are smaller than 0.6.

Therefore, it is preferred that the coefficients a, b and c and the values X and Y satisfy the following conditions (47)~(51);

$$25 \leq a \leq 43 \quad (47)$$

$$35 \leq b \leq 43 \quad (48)$$

$$14 \leq c \leq 40 \quad (49)$$

$$0.3 \leq X \leq 0.8 \quad (50)$$

$$0.3 \leq Y \leq 0.8 \quad (51).$$

Moreover, it is further preferred that the coefficients a, b and c and the values X and Y satisfy the following conditions (52)~(56);

$$30 \leq a \leq 42 \quad (52)$$

$$37 \leq b \leq 40 \quad (53)$$

$$18 \leq c \leq 33 \quad (54)$$

$$0.4 \leq X \leq 0.6 \quad (55)$$

$$0.4 \leq Y \leq 0.6 \quad (56)$$

Further, it is necessary to set a difference between X and Y larger than 0.05. In this case, it is preferred to set the difference larger than 0.1 so as to increase a piezoelectric constant $d_{31}$. Moreover, from the point of view of preventing a decrease of a Curie point, it is further preferred to set the difference smaller than 0.4.

Furthermore, if up to 10 atomic % of Pb is substituted by one or more elements selected from a group of strontium, calcium and barium, it is possible to improve a piezoelectric constant $d_{31}$ more. If a substitution rate of the metal elements is larger than 3 atomic %, a piezoelectric constant $d_{31}$ is most improved. From this point of view, it is further preferred if the substitution rate is larger than 4 atomic %. However, if the substitution rate is not smaller than 8 atomic %, a Curie point of a piezoelectric porcelain is decreased gradually. Therefore, it is preferred that the substitution rate is smaller than 8 atomic % and it is further preferred that the substitution rate is smaller than 7 atomic %.

DESCRIPTION OF THE PREFERRED EMBODIMENTS

Figure 1:
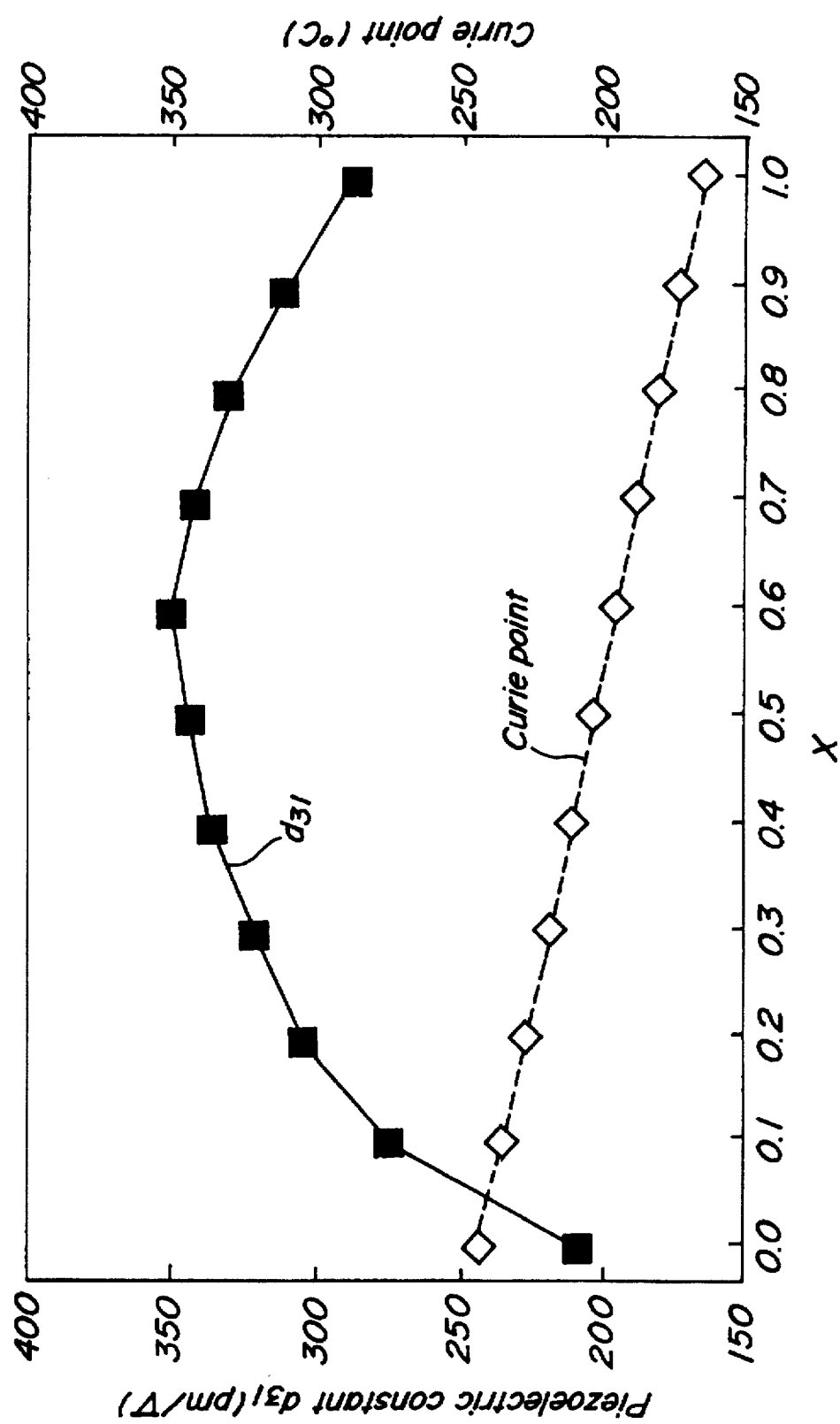
FIG. 1 is a graph showing a relation between a substitution rate X of tantalum with respect to niobium and a piezoelectric constant $d_{31}$ and a Curie point of a piezoelectric porcelain according to a first aspect of the invention in a piezoelectric porcelain of three component series having a composition of $PbTiO_3$-$PbZrO_3$-$Pb(Mg_{1/3}Nb_{2/3})O_3$.

A method of producing piezoelectric porcelains according to the invention is not limited particularly. However, the following producing method is preferred. At first, raw materials of metal compound, preferably oxides, hydroxides or carbonates of metal elements are mixed in a ball mill or the like to obtain mixed powders having a composition within the scope of the invention. Then, the thus obtained mixed powders are calcined in the atmosphere at a temperature of 900° C.~1100° C. to obtain a calcined body. The calcined body is crushed in the ball mill or the like and the crushed powders are pressed to obtain a formed body. Then, the thus obtained formed body is sintered at a temperature of 1200° C.~1300° C. to obtain a sintered body. The thus obtained sintered body is worked to obtain a specimen having a predetermined dimension and a predetermined shape. Finally, electrodes are arranged on the specimen and the specimen with the electrodes is subjected to a poling for a piezoelectric porcelain. Of course, other producing methods can be applied freely in the present invention.

Hereinafter, experiments according to a first aspect of the invention will be explained.

EXPERIMENT 1

Raw material powders of PbO, MgO, $Nb_2O_5$, $Ta_2O_5$, $TiO_2$, $ZrO_2$ were mixed in a ball mill for 24 hours to obtain mixed powders having compositions shown in a Table 1. The thus obtained mixed powders were calcined in the atmosphere at 1000° C. for 2 hours to obtain a calcined body. The thus obtained calcined body was crushed in the ball mill for 48 hours to obtain crushed powders. Then, the crushed powders were formed under a pressure of about 400 kg/cm$^2$ by means of a press machine to obtain a formed body having a diameter of 20 mm and a thickness of 5 mm. The thus obtained formed body was sintered at a temperature of 1200° C.~1300° C. for 2 hours to obtain a sintered body.

The thus obtained sintered body was worked to obtain a plate-like specimen having dimensions of 12 mm (length)×3 mm (width)×1 mm (thickness). Then, silver electrodes were arranged on the planes of the specimen, and the specimen with the silver electrodes was subjected to a poling in such a manner that a DC voltage of 2 kV/mm was applied to the specimen in a silicone oil having a temperature of 80° C. With respect to the respective specimens after a poling, a piezoelectric constant $d_{31}$ and a Curie point were measured. The measuring results are shown in Table 1 as well as coefficients a, b and c and a substitution rate X in a $Pb[Mg_{1/3}(Nb_{1-x}Ta_x)_{2/3}]O_3$-$bPbTiO_3$-$cPbZrO_3$, wherein the coefficients a, b and c were mol % and a sum of the coefficients a, b and c was 100. In sample Nos. 1~17 in the Table 1, a substitution rate X of tantalum was varied while coefficients a, b and c were set in a range within the scope of the first aspect of the invention.

TABLE 1

| Sample | Composition | | | | Piezoelectric | Curie point | Remarks |
|---|---|---|---|---|---|---|---|
| | a | b | c | X | constant $d_{31}$ | (°C.) | |
| 1 | 15 | 40 | 45 | 0 | 136 | 312 | Comparative example |
| 2 | 15 | 40 | 45 | 0.6 | 264 | 264 | Present invention |
| 3 | 15 | 35 | 50 | 0 | 107 | 284 | Comparative example |
| 4 | 15 | 35 | 50 | 0.6 | 240 | 236 | Present invention |
| 5 | 25 | 40 | 35 | 0 | 179 | 270 | Comparative example |
| 6 | 25 | 40 | 35 | 0.3 | 255 | 246 | Present invention |
| 7 | 25 | 40 | 35 | 0.7 | 293 | 214 | Present invention |
| 8 | 37.5 | 37.5 | 25 | 0 | 208 | 243 | Comparative example |
| 9 | 37.5 | 37.5 | 25 | 0.1 | 275 | 235 | Present invention |

TABLE 1-continued

| Sample | Composition a | b | c | X | Piezoelectric constant $d_{31}$ | Curie point (°C.) | Remarks |
|---|---|---|---|---|---|---|---|
| 10 | 37.5 | 37.5 | 25 | 0.4 | 336 | 211 | Present invention |
| 11 | 37.5 | 30 | 32.5 | 1.0 | 182 | 142 | Comparative example |
| 12 | 45 | 45 | 10 | 0 | 176 | 231 | Comparative example |
| 13 | 45 | 45 | 10 | 0.4 | 255 | 199 | Present invention |
| 14 | 45 | 32 | 23 | 0 | 194 | 213 | Comparative example |
| 15 | 45 | 32 | 23 | 0.3 | 250 | 189 | Present invention |
| 16 | 40 | 32 | 28 | 0 | 172 | 224 | Comparative example |
| 17 | 40 | 32 | 28 | 0.4 | 252 | 192 | Present invention |

By comparing the differences between the sample Nos. 1 and 2, between the sample Nos. 3 and 4, between the sample No. 5 and the sample Nos. 6 and 7, between the sample No. 8 and the sample Nos. 9 and 10, between the sample Nos. 12 and 13, between the sample Nos. 14 and 15 and between the sample Nos. 16 and 17, it is understood that a piezoelectric constant $d_{31}$ is improved by substituting a part of niobium by tantalum. Moreover, as shown in the sample No. 11, if the substitution rate X was 1.0, it is understood that a piezoelectric constant $d_{31}$ is decreased and a Curie point is also decreased extraordinarily.

EXPERIMENT 2

In the same manner as experiment 1, specimens according to sample Nos. 18–33 in a Table 2 were prepared. With respect to the thus prepared specimens, a piezoelectric constant $d_{31}$ and a Curie point were measured. The measuring results are shown in Table 2.

TABLE 2

| Sample | Composition a | b | c | X | Piezoelectric constant $d_{31}$ | Curie point (°C.) | Remarks |
|---|---|---|---|---|---|---|---|
| 18 | 10 | 45 | 45 | 0.4 | 215 | 294 | Comparative example |
| 19 | 15 | 40 | 45 | 0.6 | 264 | 264 | Present invention |
| 20 | 15 | 35 | 50 | 0.6 | 240 | 236 | Present invention |
| 21 | 20 | 30 | 50 | 0.4 | 200 | 224 | Comparative example |
| 22 | 25 | 25 | 50 | 0.8 | 210 | 234 | Comparative example |
| 23 | 25 | 40 | 35 | 0.3 | 255 | 246 | Present invention |
| 24 | 25 | 40 | 35 | 0.7 | 293 | 214 | Present invention |
| 25 | 37.5 | 37.5 | 25 | 0.1 | 275 | 235 | Present invention |
| 26 | 27.5 | 37.5 | 25 | 0.4 | 336 | 211 | Present invention |
| 27 | 37.5 | 30 | 32.5 | 1.0 | 182 | 142 | Comparative example |
| 28 | 45 | 45 | 10 | 0.4 | 255 | 199 | Present invention |
| 29 | 50 | 32.5 | 17.5 | 0.4 | 254 | 163 | Comparative example |
| 30 | 50 | 32.5 | 17.5 | 0.1 | 202 | 187 | Comparative example |
| 31 | 55 | 40 | 5 | 0.4 | 214 | 159 | Comparative example |
| 32 | 45 | 32 | 23 | 0.3 | 250 | 189 | Present invention |
| 33 | 40 | 32 | 28 | 0.4 | 252 | 192 | Present invention |

By comparing the a difference between the sample Nos. 18 and 19 in Table 2, it is understood that the sample No. 19 having a substitution rate X of 0.6 has an improved piezoelectric constant $d_{31}$. by comparing the sample Nos. 20 and 21, it is understood that a piezoelectric constant $d_{31}$ is decreased extraordinarily if the coefficient b is not larger than 32. The same result is also shown in the sample No. 22. In the sample Nos. 23–26, both of a piezoelectric constant $d_{31}$ and a Curie point were preferred. However, in the sample No. 27, since the substitution rate X is 1.0, a piezoelectric constant $d_{31}$ is decreased extraordinarily and a Curie point is also decreased.

By comparing sample Nos. 28 and 29, it is understood that a Curie point is decreased extraordinarily if the substitution rate X is not smaller than 45. Moreover, in the sample No. 30, since the substitution rate X is not smaller than 45, a Curie point is decreased extraordinarily and a piezoelectric constant $d_{31}$ is decreased as compared with the sample No. 29 in response to a decrease of the substitution rate X. In the sample No. 31, since the coefficient a is increased to 55 and the coefficient c is not larger than 10, a Curie point is particularly decreased. In the sample Nos. 32 and 33, both of a piezoelectric constant $d_{31}$ and a Curie point are preferred.

EXPERIMENT 3

In the same manner as experiment 1, according to sample Nos. 34–44 in Table 3 were prepared. With respect to the thus prepared specimens, a piezoelectric constant $d_{31}$ and a Curie point were measured. The measuring results were shown in Table 3. In this experiment 3, the substitution rate X of tantalum was varied from 0 to 1.0 gradually while the coefficients a, b and c were maintained constant. From the results shown in the previous experiments, it was understand that the coefficients a, b and c in the Table 3 were substantially most suitable values. Moreover, the results of this experiment 3 were shown in FIG. 1, which showed a relation between the substitution rate X and a piezoelectric constant $d_{31}$ or a Curie point.

TABLE 3

| Sample | Composition a | b | c | X | Piezoelectric constant $d_{31}$ | Curie point (°C.) | Remarks |
|---|---|---|---|---|---|---|---|
| 34 | 37.5 | 37.5 | 25 | 0 | 208 | 243 | Comparative example |
| 35 | 37.5 | 37.5 | 25 | 0.1 | 275 | 235 | Present invention |
| 36 | 37.5 | 37.5 | 25 | 0.2 | 305 | 227 | Present invention |

TABLE 3-continued

| Sample | Composition | | | | Piezoelectric constant $d_{31}$ | Curie point (°C.) | Remarks |
|---|---|---|---|---|---|---|---|
| | a | b | c | X | | | |
| 37 | 37.5 | 37.5 | 25 | 0.3 | 322 | 219 | Present invention |
| 38 | 37.5 | 37.5 | 25 | 0.4 | 336 | 211 | Present invention |
| 39 | 37.5 | 37.5 | 25 | 0.5 | 344 | 203 | Present invention |
| 40 | 37.5 | 37.5 | 25 | 0.6 | 351 | 195 | Present invention |
| 41 | 37.5 | 37.5 | 25 | 0.7 | 342 | 187 | Present invention |
| 42 | 37.5 | 37.5 | 25 | 0.8 | 330 | 179 | Present invention |
| 43 | 37.5 | 37.5 | 25 | 0.9 | 312 | 171 | Present invention |
| 44 | 37.5 | 37.5 | 25 | 1.0 | 285 | 163 | Comparative example |

From the results shown in the Table 3, it is understood that a piezoelectric constant $d_{31}$ is improved if the substitution rate X is larger than 0.1 and it is further improved if the substitution rate X is in a range of 0.3~0.8, more preferably 0.4~0.7. However, if the substitution rate X is not smaller than 0.7, a Curie point is particularly decreased. Therefore, it is preferred that the substitution rate X is smaller than 0.6. Moreover, in the case that the substitution rate X is 1.0 (i.e., all the niobium is substituted by tantalum), a piezoelectric constant $d_{31}$ is decreased and also a Curie point is decreased to a range under 170° C. as shown in the sample No. 44.

EXPERIMENT 4

In the manner as experiment 1, specimens according to sample Nos. 45~54 in Table 4 were prepared. With respect to the thus prepared specimens, a piezoelectric constant $d_{31}$ and a Curie point were measured. The measuring results are shown in Table 4. In this experiment 4, $SrCO_3$ raw material powders were added in the mixed powders and 5 atomic % of Pb was substituted by Sr.

TABLE 4

| Sample | Composition | | | | Piezoelectric constant $d_{31}$ | Curie point (°C.) | Remarks |
|---|---|---|---|---|---|---|---|
| | a | b | c | X | | | |
| 45 | 10 | 40 | 50 | 0.6 | 263 | 204 | Comparative example |
| 46 | 20 | 40 | 40 | 0.4 | 299 | 192 | Present invention |
| 47 | 25 | 50 | 25 | 0.4 | 242 | 206 | Comparative example |
| 48 | 25 | 30 | 45 | 0.5 | 237 | 142 | Comparative example |
| 49 | 37.5 | 47.5 | 15 | 0.6 | 273 | 153 | Comparative example |
| 50 | 37.5 | 37.5 | 25 | 0.0 | 272 | 183 | Comparative example |
| 51 | 37.5 | 37.5 | 25 | 0.3 | 325 | 159 | Present invention |
| 52 | 37.5 | 37.5 | 25 | 1.0 | 302 | 103 | Comparative example |
| 53 | 37.5 | 30 | 32.5 | 0.4 | 245 | 130 | Comparative example |
| 54 | 50 | 35 | 15 | 0.4 | 291 | 110 | Comparative example |

From results shown in the Table 4, if the substitution rate X of tantalum is set in a range of 0.1~0.9 under such a condition that the coefficients a, b and c are maintained constantly as shown in the Table 4, it is possible to improve both of a piezoelectric constant $d_{31}$ and a Curie point.

EXPERIMENT 5

In the same manner as experiment 4, specimens according to sample Nos. 55~64 in Table 5 were prepared. With respect to the thus prepared specimens, a piezoelectric constant $d_{31}$ and a Curie point measured. The measuring results are shown in Table 5. In this experiment 5, $CoCO_3$ raw material powders were added in the mixed powders and 5 atomic % of Pb was substituted by Ca.

TABLE 5

| Sample | Composition | | | | Piezoelectric constant $d_{31}$ | Curie point (°C.) | Remarks |
|---|---|---|---|---|---|---|---|
| | a | b | c | X | | | |
| 55 | 10 | 40 | 50 | 0.6 | 270 | 194 | Comparative example |
| 56 | 20 | 40 | 40 | 0.4 | 306 | 182 | Present invention |
| 57 | 25 | 50 | 25 | 0.4 | 248 | 196 | Comparative example |
| 58 | 25 | 30 | 45 | 0.5 | 243 | 132 | Comparative example |
| 59 | 37.5 | 47.5 | 15 | 0.6 | 280 | 143 | Comparative example |
| 60 | 37.5 | 37.5 | 25 | 0.0 | 279 | 173 | Comparative example |
| 61 | 37.5 | 37.5 | 25 | 0.3 | 332 | 149 | Present invention |
| 62 | 37.5 | 37.5 | 25 | 1.0 | 309 | 93 | Comparative example |
| 63 | 37.5 | 30 | 32.5 | 0.4 | 252 | 120 | Comparative example |
| 64 | 50 | 35 | 15 | 0.4 | 298 | 100 | Comparative example |

From the results shown in Table 5, if the substitution rate X of tantalum is set in a range of 0.1~0.9 under such a condition that the coefficients a, b and c are maintained constant as shown in Table 5, it is possible to improve both of a piezoelectric constant $d_{31}$ and a Curie point.

EXPERIMENT 6

In the same manner as experiment 4, specimens according to sample Nos. 65~74 in Table 6 were prepared. With respect to the thus prepared specimens, a piezoelectric constant $d_{31}$ and a Curie point were measured. The measuring results are shown in the Table 6. In this experiment 6, $BaCO_3$ raw material powders were added in the mixed powders and 5 atomic % of Pb was substituted by Ba.

TABLE 6

| Sample | Composition | | | | Piezoelectric constant $d_{31}$ | Curie point (°C.) | Remarks |
|---|---|---|---|---|---|---|---|
| | a | b | c | X | | | |
| 65 | 10 | 40 | 50 | 0.6 | 262 | 209 | Comparative example |
| 66 | 20 | 40 | 40 | 0.4 | 297 | 197 | Present invention |
| 67 | 25 | 50 | 25 | 0.4 | 241 | 211 | Comparative example |
| 68 | 25 | 30 | 45 | 0.5 | 236 | 147 | Comparative example |

TABLE 6-continued

| Sample | Composition a | b | c | X | Piezoelectric constant $d_{31}$ | Curie point (°C.) | Remarks |
|---|---|---|---|---|---|---|---|
| 69 | 37.5 | 47.5 | 15 | 0.6 | 272 | 158 | Comparative example |
| 70 | 37.5 | 37.5 | 25 | 0.0 | 270 | 188 | Comparative example |
| 71 | 37.5 | 37.5 | 25 | 0.3 | 323 | 164 | Present invention |
| 72 | 37.5 | 37.5 | 25 | 1.0 | 300 | 108 | Comparative example |
| 73 | 37.5 | 30 | 32.5 | 0.4 | 244 | 135 | Comparative example |
| 74 | 50 | 35 | 15 | 0.4 | 290 | 115 | Comparative example |

From the results shown in Table 6, if the substitution rate X of tantalum is set in a range of 0.1~0.9 under such a condition that the coefficients a, b and c are maintained constant as shown in the Table 6, it is possible to improve both a piezoelectric constant $d_{31}$ and a Curie point.

EXPERIMENT 7

In the previous experiments, use was made of oxide powders as raw material powders. In this experiment 7, use was made of hydroxide powders or carbonate powders of metal elements rather than oxide powders, and specimens were prepared in the same manner as the previous experiments. With respect to the specimens, a piezoelectric constant $d_{31}$ and a Curie point were measured. As a result, the specimens according to this experiment 7 have substantially the same piezoelectric constant $d_{31}$ and a Curie point as those of the previous experiments.

As mentioned above, according to the first aspect of the invention, since a part of niobium in the piezoelectric porcelain having a composition of $PbTiO_3$-$PbZrO_3$-$Pb(Mg_{1/3}Nb_{2/3})O_3$ is substituted by tantalum, a piezoelectric constant $d_{31}$ can be improved extraordinarily.

Hereinafter, experiments according to a second aspect of the invention will be explained.

EXPERIMENT 8

Raw material powders of PbO, MgO, NiO, $Nb_2O_5$, $Ta_2O_5$, $TiO_2$, $ZrO_2$ were mixed in a ball mill for 24 hours to obtain mixed powders having compositions shown in Table 7. The thus obtained mixed powders were calcined in the atmosphere at 1000° C. for 2 hours to obtain a calcined body. The thus obtained calcined body was crushed in the ball mill for 48 hours to obtain crushed powders. Then, the crushed powders were formed under a pressure of about 400 kg/cm² by means of a press machine to obtain a formed body having a diameter of 20 mm and a thickness of 5 mm. The thus obtained formed body was sintered at a temperature of 1200° C.~1300° C. for 2 hours to obtain a sintered body.

The thus obtained sintered body was worked to obtain a plate-like specimen having a dimensions of 12 mm (length) ×3 mm (width)×1 mm (thickness). Then, silver electrodes were arranged on the planes of the specimen, and the specimen with the silver electrodes was subjected to a poling in such a manner that a DC voltage of 2 kV/mm was applied to the specimen in a silicone oil having a temperature of 80° C. With respect to the respective specimens after a poling, a piezoelectric constant $d_{31}$ and a Curie point were measured. The measuring results are shown in Table 7 as well as coefficients a, b and c and substitution rates X and Y in $aPb[Mg_{1-x}Ni_x)_{1/3}(Nb_{1-y}Ta_y)_{2/3}]O_3$-$bPbTiO_3$-$cPbZrO_3$, wherein the coefficients a, b and c were mol % and a sum of the coefficients a, b and c was 100. In sample Nos. 101~118 in Table 7, substitution rates X and Y and the coefficients a, b and c were varied respectively.

TABLE 7

| Sample | Composition a | b | c | X | Y | Piezoelectric constant $d_{31}$ | Curie point (°C.) | Remarks |
|---|---|---|---|---|---|---|---|---|
| 101 | 10 | 45 | 45 | 0.2 | 0.4 | 217 | 284 | Comparative example |
| 102 | 15 | 40 | 45 | 0.3 | 0.7 | 260 | 241 | Present invention |
| 103 | 15 | 35 | 50 | 0 | 0.5 | 202 | 244 | Comparative example |
| 104 | 15 | 35 | 50 | 0.4 | 0.6 | 251 | 216 | Present invention |
| 105 | 20 | 30 | 50 | 0.6 | 0.9 | 206 | 154 | Comparative example |
| 106 | 25 | 25 | 50 | 0.1 | 0.1 | 163 | 285 | Comparative example |
| 107 | 25 | 40 | 35 | 0.3 | 0.7 | 310 | 199 | Present invention |
| 108 | 25 | 40 | 35 | 0.5 | 0.8 | 301 | 181 | Present invention |
| 109 | 37.5 | 37.5 | 25 | 0.5 | 1.0 | 304 | 138 | Comparative example |
| 110 | 37.5 | 37.5 | 25 | 0.2 | 0.5 | 345 | 193 | Present invention |
| 111 | 37.5 | 37.5 | 25 | 0.4 | 0.6 | 366 | 175 | Present invention |
| 112 | 37.5 | 30 | 32.5 | 0.9 | 1.0 | 168 | 97 | Comparative example |
| 113 | 45 | 45 | 10 | 0.3 | 0.4 | 268 | 184 | Present invention |
| 114 | 50 | 32.5 | 17.5 | 0.3 | 0.4 | 266 | 148 | Comparative example |
| 115 | 50 | 32.5 | 17.5 | 0.1 | 0.9 | 240 | 118 | Comparative example |
| 116 | 55 | 40 | 5 | 0.4 | 0.8 | 217 | 107 | Comparative example |
| 117 | 45 | 32 | 23 | 0.2 | 0.4 | 273 | 171 | Present invention |
| 118 | 40 | 32 | 28 | 0.3 | 0.4 | 266 | 177 | Present invention |

If the sample Nos. 102, 103 and 104 are compared, it is understood that a piezoelectric constant $d_{31}$ is decreased extraordinarily in the sample No. 103 in which the substitution rate X is 0 i.e. no nickel exists. In the sample No. 105 in which the coefficient b is out of the scope of the second aspect of the invention, it is understood that a piezoelectric constant $d_{31}$ is decreased and a Curie point is also decreased. If the sample Nos. 106, 107 and 108 are compared, it is understood that a piezoelectric constant $d_{31}$ is decreased extraordinarily in the sample No. 106 in which the substitution rates X and Y are identical, but, in the sample Nos. 107 and 108 in which the coefficients a, b and c are same as those of the sample No. 106, a piezoelectric constant $d_{31}$ is larger than 300 pm/V. If the sample No. 109, 110, 111 and 112 are compared, it is understood that a Curie point is decreased extraordinarily in the sample No. 109 and thus the sample No. 109 has a problem for an actual use. In the sample No. 110 and 111, it is understood that both of a piezoelectric constant $d_{31}$ and a Curie point are improved. In the sample No. 112 in which no niobium exists, it is understood that both of a piezoelectric constant $d_{31}$ and a Curie point are decreased extraordinarily.

In the sample No. 113, it is understood that a piezoelectric constant $d_{31}$ is increased. In the sample Nos. 114, 115 and 116, it is understood that the coefficient a is larger than 50, but a Curie point is decreased extraordinarily. In the sample No. 117 and 118 having similar composition as that of the sample Nos. 114~116, both of a piezoelectric constant $d_{31}$ and a Curie point are increased extraordinarily.

EXPERIMENT 9

In the same manner as the experiment 8, specimens according to sample Nos. 119~132 in Table 8 were prepared. With respect to the thus prepared specimens, a piezoelectric constant $d_{31}$ and a Curie point were measured. The measuring results were shown in Table 8. In the experiment 9, the substitution rates X and Y were varied while the coefficients a, b and c were maintained constant within the scope of the second aspect of the invention.

TABLE 8

| Sam- | Composition | | | | | Piezoelectric | Curie point | |
|---|---|---|---|---|---|---|---|---|
| ple | a | b | c | X | Y | constant $d_{31}$ | (°C.) | Remarks |
| 119 | 15 | 40 | 45 | 0.3 | 0.8 | 245 | 223 | Present invention |
| 120 | 15 | 40 | 45 | 0.8 | 0.8 | 225 | 208 | Comparative example |
| 121 | 15 | 35 | 50 | 0.2 | 0.6 | 247 | 226 | Present invention |
| 122 | 15 | 35 | 50 | 0.2 | 0.2 | 188 | 258 | Comparative example |
| 123 | 25 | 40 | 35 | 0.3 | 0.7 | 310 | 199 | Present invention |
| 124 | 25 | 40 | 35 | 0.7 | 0.7 | 303 | 179 | Comparative example |
| 125 | 37.5 | 37.5 | 25 | 0.1 | 0.9 | 299 | 166 | Present invention |
| 126 | 37.5 | 37.5 | 25 | 0.8 | 0.8 | 308 | 139 | Comparative example |
| 127 | 45 | 45 | 10 | 0.3 | 0.4 | 268 | 184 | Present invention |
| 128 | 45 | 45 | 10 | 0.7 | 0.7 | 269 | 140 | Comparative example |
| 129 | 45 | 32 | 23 | 0.1 | 0.6 | 296 | 160 | Present invention |
| 130 | 45 | 32 | 23 | 0.6 | 0.6 | 300 | 135 | Comparative example |
| 131 | 40 | 32 | 28 | 0.2 | 0.6 | 289 | 166 | Present invention |
| 132 | 40 | 32 | 28 | 0.6 | 0.6 | 294 | 146 | Comparative example |

If the sample Nos. 119 and 120 are compared, it is understood that both of a piezoelectric constant $d_{31}$ and a Curie point are increased in the sample No. 119 in which the substitution rate Y is larger than the substitution rate X. If the sample Nos. 121 and 122 are compared, it is understood that a piezoelectric constant $d_{31}$ is increased extraordinarily in the sample No. 121 in which a substitution rate Y of tantalum is larger than that of the sample No. 122. If the sample Nos. 123 and 124 are compared, it is understood that both of a piezoelectric constant $d_{31}$ and a Curie point are improved largely in the sample No. 123 in which the substitution rate Y is larger than the substitution rate X. If the sample Nos. 127 and 128 are compared, it is understood that a Curie point is improved in the sample No. 127 according to the second aspect of the invention. If the sample Nos. 129 and 130 are compared, it is understood that a Curie point is decreased to a region under 150° C. in the sample No. 130. If the sample Nos. 131 and 132 are compared, it is understood that a Curie point is decreased to a region under 150° C. in the sample No. 132.

EXPERIMENT 10

In the same manner as experiment 8, specimens according to sample Nos. 133~144 in Table 9 were prepared. With respect to the thus prepared specimens, a piezoelectric constant $d_{31}$ and a Curie point were measured. The measuring results are shown in Table 9. In the experiment 9, the coefficients a, b and c were varied while the substitution rate X was maintained at 0.2 and the substitution rate Y was maintained at 0.4.

TABLE 9

| Sam- | Composition | | | | | Piezoelectric | Curie point | |
|---|---|---|---|---|---|---|---|---|
| ple | a | b | c | X | Y | constant $d_{31}$ | (°C.) | Remarks |
| 133 | 10 | 40 | 50 | 0.2 | 0.4 | 222 | 270 | Comparative example |
| 134 | 15 | 40 | 45 | 0.2 | 0.4 | 243 | 270 | Present invention |
| 135 | 20 | 30 | 50 | 0.2 | 0.4 | 211 | 214 | Comparative example |
| 136 | 25 | 25 | 50 | 0.2 | 0.4 | 225 | 256 | Comparative example |
| 137 | 25 | 40 | 35 | 0.2 | 0.4 | 290 | 228 | Present invention |
| 138 | 37.5 | 37.5 | 25 | 0.2 | 0.4 | 328 | 201 | Present invention |
| 139 | 37.5 | 30 | 32.5 | 0.2 | 0.4 | 228 | 180 | Comparative example |
| 140 | 45 | 45 | 10 | 0.2 | 0.4 | 265 | 189 | Present invention |
| 141 | 50 | 32.5 | 17.5 | 0.2 | 0.4 | 263 | 153 | Comparative example |
| 142 | 55 | 40 | 5 | 0.2 | 0.4 | 219 | 149 | Comparative example |
| 143 | 45 | 32 | 23 | 0.2 | 0.4 | 273 | 171 | Present invention |
| 144 | 40 | 32 | 28 | 0.2 | 0.4 | 262 | 182 | Present invention |

If the sample Nos. 135, 136 and 137 are compared, it is understood that piezoelectric constants $d_{31}$ of the sample Nos. 135 and 136, in which the coefficient b is not larger than 32, are decreased extraordinarily as compared with the sample No. 137. If the sample Nos. 138 and 139 are compared, it is understood that a piezoelectric constant $d_{31}$ of the sample No. 139, in which the coefficient b is not larger than 32, is decreased extraordinarily. If the sample Nos. 140~144 are compared, it is understood that a Curie point of the sample No. 141, in which the coefficient a is larger than 45, is decreased largely as compared with that of the sample No. 140, 143 and 144 according to the second aspect of the invention. In the sample No. 142, in which the coefficient a is larger than 45 and the coefficient c is not larger than 10, it is understood that both of a piezoelectric constant $d_{31}$ and a Curie point are decreased extraordinarily.

EXPERIMENT 11

Figure 2:
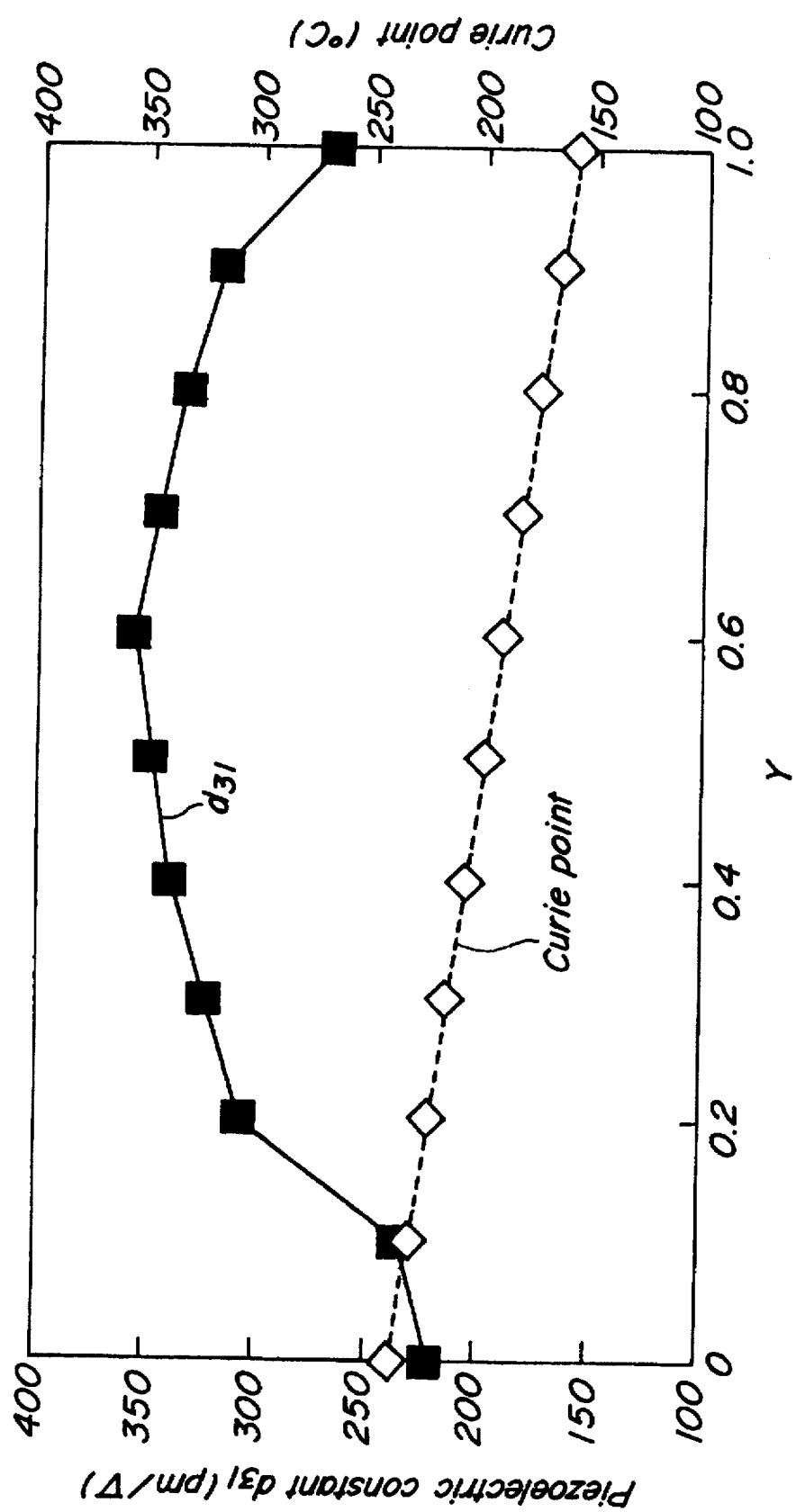
FIG. 2 is a graph illustrating a relation between a substitution rate Y and a piezoelectric constant $d_{31}$ and a Curie point of a piezoelectric porcelain according to a second aspect of the invention under such a condition that coefficients a, b and c are set in a range within the scope of the second aspect of the invention and also a substitution rate Y is varied from 0.0 to 1.0 while a substitute rate X is constant at 0.1.

In the same manner as experiment 8, specimens according to sample Nos. 145~155 in Table 10 were prepared. With respect to the thus prepared specimens, a piezoelectric constant $d_{31}$ and a Curie point were measured. The measuring results are shown in Table 10. In the experiment 11, the substitution rate Y was varied while the coefficients a, b and c were maintained constantly within the scope of the second aspect of the invention and the substitution rate X is maintained at 0.1. Moreover, a relation between the substitution rate Y and a piezoelectric constant $d_{31}$ or a Curie point is shown in FIG. 2.

TABLE 10

| Sample | Composition a | b | c | X | Y | Piezoelectric constant $d_{31}$ | Curie point (°C.) | Remarks |
|---|---|---|---|---|---|---|---|---|
| 145 | 37.5 | 37.5 | 25 | 0.1 | 0 | 221 | 238 | Comparative example |
| 146 | 37.5 | 37.5 | 25 | 0.1 | 0.1 | 235 | 230 | Comparative example |
| 147 | 37.5 | 37.5 | 25 | 0.1 | 0.2 | 307 | 222 | Present invention |
| 148 | 37.5 | 37.5 | 25 | 0.1 | 0.3 | 323 | 214 | Present invention |
| 149 | 37.5 | 37.5 | 25 | 0.1 | 0.4 | 340 | 206 | Present invention |
| 150 | 37.5 | 37.5 | 25 | 0.1 | 0.5 | 348 | 198 | Present invention |
| 151 | 37.5 | 37.5 | 25 | 0.1 | 0.6 | 356 | 190 | Present invention |
| 152 | 37.5 | 37.5 | 25 | 0.1 | 0.7 | 345 | 182 | Present invention |
| 153 | 37.5 | 37.5 | 25 | 0.1 | 0.8 | 333 | 174 | Present invention |
| 154 | 37.5 | 37.5 | 25 | 0.1 | 0.9 | 317 | 166 | Present invention |
| 155 | 37.5 | 37.5 | 25 | 0.1 | 1.0 | 268 | 158 | Comparative example |

From the results shown in the Table 10, it is understood that, in the samples having the substitution rate Y of 0.2~0.9, a piezoelectric constant $d_{31}$ is increased largely to a level of more than 300 pm/V and also a Curie point is increased to a level more than 166° C. In the sample No. 145 in which the substitution rate Y is 0, it is understood that a piezoelectric constant $d_{31}$ is decreased. Moreover, in the sample No. 155 in which the substitution rate Y is 1.0, it is understood that both of a piezoelectric constant $d_{31}$ and a Curie point are decreased largely. In the case that the substitution rate Y=0.1 (i.e. the substitution rate X is equal to the substitution rate Y), it is understood that a piezoelectric constant $d_{31}$ is decreased. Moreover, it is understood that a piezoelectric constant $d_{31}$ can be made more than 320 pm/V if the substitution rate Y is in a range of 0.3~0.8 and also it can be made more than 340 pm/V if the substitution rate Y is in a range of 0.4~0.7. Moreover, it is understood that, in order to obtain a Curie point greater than 190° C., it is necessary to limit the substitution rate Y to be smaller than 0.6.

EXPERIMENT 12

In the same manner as experiment 11, specimens according to sample Nos. 156~166 in Table 11 were prepared. With respect to the thus prepared specimens, a piezoelectric constant $d_{31}$ and a Curie point were measured. The measuring results are shown in Table 11. In this experiment 12, $CoCO_3$ raw material powders were added in the mixed powders ad 5 atomic % of Pb was substituted by Ca.

TABLE 11

| Sample | Composition a | b | c | X | Y | Piezoelectric constant $d_{31}$ | Curie point (°C.) | Remarks |
|---|---|---|---|---|---|---|---|---|
| 156 | 10 | 40 | 50 | 0.6 | 0.8 | 249 | 148 | Comparative example |
| 157 | 20 | 40 | 40 | 0.4 | 0.6 | 343 | 146 | Present invention |
| 158 | 20 | 40 | 40 | 0.4 | 1.0 | 286 | 114 | Comparative example |
| 159 | 25 | 50 | 25 | 0.4 | 0.6 | 275 | 160 | Comparative example |
| 160 | 25 | 30 | 45 | 0.1 | 0.8 | 230 | 103 | Comparative example |
| 161 | 37.5 | 47.5 | 15 | 0.4 | 0.6 | 280 | 123 | Comparative example |
| 162 | 37.5 | 37.5 | 25 | 0.0 | 0.3 | 332 | 149 | Comparative example |
| 163 | 37.5 | 37.5 | 25 | 0.2 | 0.4 | 355 | 131 | Present invention |
| 164 | 37.5 | 37.5 | 25 | 0.7 | 0.7 | 354 | 82 | Comparative example |
| 165 | 37.5 | 30 | 32.5 | 0.4 | 0.6 | 273 | 84 | Comparative example |
| 166 | 50 | 35 | 15 | 0.3 | 0.7 | 310 | 61 | Comparative example |

From the results shown in Table 11, if the substitution rate X of nickel with respect to magnesium and the substitution rate Y of tantalum with respect to niobium are within the scope of the second aspect of the invention while the coefficients a, b and c are also within the scope of the second aspect of the invention, it is possible to improve both of a piezoelectric constant $d_{31}$ and a Curie point.

EXPERIMENT 13

In the same manner as the experiment 11, specimens according to sample Nos. 167~177 in a Table 12 were prepared. With respect to the thus prepared specimens, a piezoelectric constant $d_{31}$ and a Curie point were measured. The measuring results were shown in Table 12. In this experiment 13, $SrCO_3$ raw material powders were added in the mixed powders and 5 atomic % of Pb was substituted by Sr.

TABLE 12

| Sample | Composition a | b | c | X | Y | Piezoelectric constant $d_{31}$ | Curie point (°C.) | Remarks |
|---|---|---|---|---|---|---|---|---|
| 167 | 10 | 40 | 50 | 0.6 | 0.8 | 243 | 158 | Comparative example |
| 168 | 20 | 40 | 40 | 0.4 | 0.6 | 335 | 156 | Present invention |
| 169 | 20 | 40 | 40 | 0.4 | 1.0 | 279 | 124 | Comparative example |
| 170 | 25 | 50 | 25 | 0.4 | 0.6 | 268 | 170 | Comparative example |
| 171 | 25 | 30 | 45 | 0.1 | 0.8 | 224 | 113 | Comparative example |
| 172 | 37.5 | 47.5 | 15 | 0.4 | 0.6 | 273 | 133 | Comparative example |
| 173 | 37.5 | 37.5 | 25 | 0.0 | 0.3 | 325 | 159 | Comparative example |
| 174 | 37.5 | 37.5 | 25 | 0.2 | 0.4 | 347 | 141 | Present invention |
| 175 | 37.5 | 37.5 | 25 | 0.7 | 0.7 | 347 | 92 | Comparative example |
| 176 | 37.5 | 30 | 32.5 | 0.4 | 0.6 | 266 | 94 | Comparative example |
| 177 | 50 | 35 | 15 | 0.3 | 0.7 | 303 | 71 | Comparative example |

From the results shown in the Table 12, if the substitution rate X of nickel with respect to magnesium and the substitution rate Y of tantalum with respect to niobium are within the scope of the second aspect of the invention while the coefficients a, b and c are also within the scope of the second aspect of the invention, it is possible to improve both of a piezoelectric constant $d_{31}$ and a Curie point.

EXPERIMENT 14

In the same manner as experiment 11, specimens according to sample Nos. 178~188 in Table 13 were prepared. With respect to the thus prepared specimens, a piezoelectric constant $d_{31}$ and a Curie point were measured. The measuring results are shown in Table 13. In this experiment 14, $BaCO_3$ raw material powders were added in the mixed powders and 5 atomic % of Pb was substituted by Ba.

TABLE 13

| Sample | Composition | | | | | Piezoelectric constant $d_{31}$ | Curie point (°C.) | Remarks |
|---|---|---|---|---|---|---|---|---|
| | a | b | c | X | Y | | | |
| 178 | 10 | 40 | 50 | 0.6 | 0.8 | 242 | 163 | Comparative example |
| 179 | 20 | 40 | 40 | 0.4 | 0.6 | 334 | 161 | Present invention |
| 180 | 20 | 40 | 40 | 0.4 | 1.0 | 278 | 129 | Comparative example |
| 181 | 25 | 50 | 25 | 0.4 | 0.6 | 267 | 175 | Comparative example |
| 182 | 25 | 30 | 45 | 0.1 | 0.8 | 223 | 118 | Comparative example |
| 183 | 37.5 | 47.5 | 15 | 0.4 | 0.6 | 273 | 138 | Comparative example |
| 184 | 37.5 | 37.5 | 25 | 0.0 | 0.3 | 323 | 164 | Comparative example |
| 185 | 37.5 | 37.5 | 25 | 0.2 | 0.5 | 359 | 138 | Present invention |
| 186 | 37.5 | 37.5 | 25 | 0.7 | 0.7 | 346 | 97 | Comparative example |
| 187 | 37.5 | 30 | 32.5 | 0.4 | 0.6 | 265 | 99 | Comparative example |
| 188 | 50 | 35 | 15 | 0.3 | 0.7 | 302 | 76 | Comparative example |

From the results shown in the Table 13, if the substitution rate X of nickel with respect to magnesium and the substitution rate Y of tantalum with respect to niobium are within the scope of the second aspect of the invention while the coefficients a, b and c are also within the scope of the second aspect of the invention, it is possible to improve both of a piezoelectric constant $d_{31}$ and a Curie point.

EXPERIMENT 15

In the previous experiments, use was made of oxide powders as raw material powders. In this experiment 15, use was made of hydroxide powders or carbonate powders of metal elements rather than oxide powders, and specimens were prepared in the same manner as the previous experiments. With respect to the specimens, a piezoelectric constant $d_{31}$ and a Curie point were measured. As a result, the specimens according to this experiment 15 have substantially same piezoelectric constant $d_{31}$ and a Curie point as those of the previous experiments.

As mentioned above, according to the second aspect of the invention, a piezoelectric constant $d_{31}$ and a Curie point can be improved extraordinarily.

Hereinafter, experiments according to a third aspect of the invention will be explained.

EXPERIMENT 16

Raw material powders of PbO, MgO, NiO, $Nb_2O_5$, $Ta_2O_5$, $TiO_2$, $ZrO_2$ were mixed in a ball mill for 24 hours to obtain mixed powders having compositions shown in Table 14. The thus obtained mixed powders were calcined in the atmosphere at 1000° C. for 2 hours to obtain a calcined body. The thus obtained calcined body was crushed in the ball mill for 48 hours to obtain crushed powders. Then, the crushed powders were formed under a pressure of about 400 kg/cm² by means of a press machine to obtain a formed body having a diameter of 20 mm and a thickness of 5 mm. The thus obtained formed body was sintered at a temperature of 1200° C.~1300° C. for 2 hours to obtain a sintered body.

The thus obtained sintered body was worked to obtain a plate-like specimen having a dimensions of 12 mm (length) ×3 mm (width)×1 mm (thickness). Then, silver electrodes were arranged on the planes of the specimen, and the specimen with the silver electrodes was subjected to a poling in such a manner that a DC voltage of 2 kV/mm was applied to the specimen in a silicone oil having a temperature of 80° C. With respect to the respective specimens after a poling, a piezoelectric constant $d_{31}$ and a Curie point were measured. The measuring results are shown in Table 14 as well as coefficients a, b and c and substitution rates X and Y in $aPb[Mg_{1-X}Ni_X)_{1/3}(Nb_{1-Y}Ta_Y)_{2/3}]O_3$-$bPbTiO_3$-$cPbZrO_3$, wherein the coefficients a, b and c were mol % and a sum of the coefficients a, b and c was 100. In sample Nos. 201~218 in the Table 14, substitution rates X and Y and coefficients a, b and c were varied respectively.

TABLE 14

| Sample | Composition | | | | | Piezoelectric constant $d_{31}$ | Curie point (°C.) | Remarks |
|---|---|---|---|---|---|---|---|---|
| | a | b | c | X | Y | | | |
| 201 | 10 | 45 | 45 | 0.6 | 0.2 | 216 | 280 | Comparative example |
| 202 | 15 | 40 | 45 | 0.6 | 0.5 | 269 | 242 | Present invention |
| 203 | 15 | 35 | 50 | 0.5 | 0 | 156 | 259 | Comparative example |
| 204 | 15 | 35 | 50 | 0.6 | 0.5 | 243 | 214 | Present invention |
| 205 | 20 | 30 | 50 | 0.6 | 0.3 | 211 | 202 | Comparative example |
| 206 | 25 | 25 | 50 | 0.2 | 0.2 | 192 | 272 | Comparative example |
| 207 | 25 | 40 | 35 | 0.7 | 0.3 | 278 | 211 | Present invention |
| 208 | 25 | 40 | 35 | 0.4 | 0.2 | 268 | 234 | Present invention |
| 209 | 37.5 | 37.5 | 25 | 1.0 | 0.5 | 294 | 153 | Comparative example |
| 210 | 37.5 | 37.5 | 25 | 0.8 | 0.2 | 283 | 187 | Present invention |
| 211 | 37.5 | 37.5 | 25 | 0.4 | 0.2 | 303 | 207 | Present invention |
| 212 | 38 | 30 | 33 | 1.0 | 0.5 | 193 | 132 | Comparative example |
| 213 | 45 | 45 | 10 | 0.4 | 0.3 | 258 | 187 | Present invention |
| 214 | 50 | 33 | 18 | 0.4 | 0.3 | 256 | 151 | Comparative example |
| 215 | 50 | 33 | 18 | 0.8 | 0.2 | 220 | 139 | Comparative example |
| 216 | 55 | 40 | 5 | 0.8 | 0.4 | 194 | 119 | Comparative example |
| 217 | 45 | 32 | 23 | 0.4 | 0.2 | 253 | 177 | Present invention |
| 218 | 40 | 32 | 28 | 0.5 | 0.2 | 246 | 183 | Present invention |

In the sample No. 201, it is understood that the coefficient a is decreased and thus a piezoelectric constant $d_{31}$ is decreased. If the sample Nos. 202, 203 and 204 are compared, it is understood that a piezoelectric constant $d_{31}$ is decreased extraordinarily in the sample No. 203 in which the substitution rate Y is 0 (i.e. no tantalum exists tantalum). In the sample No. 205 in which the coefficient b is out of the scope of the third aspect of the invention, it is understood that a piezoelectric constant $d_{31}$ is decreased. If the sample Nos. 206, 207 and 208 are compared, it is understood that a piezoelectric constant $d_{31}$ is decreased extraordinarily in the sample No. 206 in which the substitution rates X and Y are identical, but, in the sample Nos. 207 and 208 in which the coefficients a, b and c are same as those of the sample No. 206, a piezoelectric constant $d_{31}$ is improved. If the sample Nos. 209, 210, 211 and 212 are compared, it is understood that a Curie point is decreased extraordinarily in the sample No. 209 in which the substitution rate X is 1.0 (i.e., no magnesium) exists and thus the sample No. 209 has a problem for an actual use. In the sample Nos. 210 and 211, it is understood that a piezoelectric constant $d_{31}$ is improved extraordinarily. In the sample No. 212 in which no magnesium exists, it is understood that both of a piezoelectric constant $d_{31}$ and a Curie point are decreased extraordinarily.

If the sample Nos. 213, 214 and 215 are compared, it is understood that a Curie point is decreased in the sample Nos. 214 and 215 wherein the coefficient a is larger than 45. Moreover, if the sample Nos. 216, 217 and 218 are compared, it is understood that a Curie point is decreased in the sample No. 216 wherein the coefficient a is larger than 45 and the coefficient c is not larger than 10.

EXPERIMENT 17

As is the same as the experiment 16, specimens according to sample Nos. 219~232 in Table 15 were prepared. With respect to the thus prepared specimens, a piezoelectric constant $d_{31}$ and a Curie point were measured. The measuring results are shown in Table 15. In the experiment 17, the substitution rates X and Y were varied while the coefficients a, b and c were maintained constant within the scope of the third aspect of the invention.

TABLE 15

| Sam- | Composition | | | | | Piezoelectric | Curie point | |
|---|---|---|---|---|---|---|---|---|
| ple | a | b | c | X | Y | constant $d_{31}$ | (°C.) | Remarks |
| 219 | 15 | 40 | 45 | 0.7 | 0.5 | 255 | 237 | Present invention |
| 220 | 15 | 40 | 45 | 0.8 | 0.8 | 225 | 208 | Comparative example |
| 221 | 15 | 35 | 50 | 0.6 | 0.5 | 243 | 214 | Present invention |
| 222 | 15 | 35 | 50 | 0.7 | 0.7 | 227 | 193 | Comparative example |
| 223 | 25 | 40 | 35 | 0.8 | 0.3 | 262 | 206 | Present invention |
| 224 | 25 | 40 | 35 | 0.8 | 0.8 | 273 | 166 | Comparative example |
| 225 | 37.5 | 37.5 | 25 | 0.7 | 0.2 | 299 | 192 | Present invention |
| 226 | 37.5 | 37.5 | 25 | 0.7 | 0.7 | 339 | 152 | Comparative example |
| 227 | 45 | 45 | 10 | 0.7 | 0.3 | 249 | 172 | Present invention |
| 228 | 45 | 45 | 10 | 0.7 | 0.7 | 269 | 140 | Comparative example |
| 229 | 45 | 32 | 23 | 0.5 | 0.2 | 256 | 172 | Present invention |
| 230 | 45 | 32 | 23 | 0.5 | 0.5 | 290 | 148 | Comparative example |
| 231 | 40 | 32 | 28 | 0.6 | 0.3 | 261 | 170 | Present invention |

TABLE 15-continued

| Sam- | Composition | | | | | Piezoelectric | Curie point | |
|---|---|---|---|---|---|---|---|---|
| ple | a | b | c | X | Y | constant $d_{31}$ | (°C.) | Remarks |
| 232 | 40 | 32 | 28 | 0.7 | 0.7 | 267 | 133 | Comparative example |

If the sample Nos. 219 and 220 are compared, it is understood that both of a piezoelectric constant $d_{31}$ and a Curie point are increased in the sample No. 219 in which the substitution rate X is larger than the substitution rate Y. If the sample Nos. 221 and 222 are compared, it is understood that a piezoelectric constant $d_{31}$ and a Curie point are increased in the sample No. 121 in which the substitution rate X is larger than the substitution rate Y. If the sample Nos. 223 and 224 are compared, it is understood that a Curie point is largely decreased in the sample No. 224 in which the substitution rate X is equal to the substitution rate Y. If the sample Nos. 225 and 226 are compared, it is understood that a Curie point is largely decreased to a level of about 150° C. in the sample No. 226 in which the substitution rate X is equal to the substitution rate Y and thus the sample No. 226 has a problem for actual use.

If the sample Nos. 227 and 228 are compared, it is understood that a Curie point is largely decreased to a level under 150° C. in the sample No. 228 in which the substitution rate X is equal to the substitution rate Y and thus the sample No. 228 has a problem for an actual use. If the sample Nos. 229 and 230 are compared, it is understood that a Curie point is largely decreased in the sample No. 230 in which the substitution rate X is equal to the substitution rate Y. If the sample Nos. 231 and 232 are compared, it is understood that a Curie point is decreased to a region under 150° C. in the sample No. 232.

EXPERIMENT 18

As is the same as the experiment 16, specimens according to sample Nos. 233~242 in Table 16 were prepared. With respect to the thus prepared specimens, a piezoelectric constant $d_{31}$ and a Curie point were measured. The measuring results are shown in Table 16. In the experiment 16, the coefficients a, b and c were varied while the substitution rate X was maintained at 0.5 and the substitution rate Y is was maintained at 0.3.

TABLE 16

| Sam- | Composition | | | | | Piezoelectric | Curie point | |
|---|---|---|---|---|---|---|---|---|
| ple | a | b | c | X | Y | constant $d_{31}$ | (°C.) | Remarks |
| 233 | 15 | 40 | 45 | 0.5 | 0.3 | 242 | 263 | Present invention |
| 234 | 20 | 30 | 50 | 0.5 | 0.3 | 209 | 207 | Comparative example |
| 235 | 25 | 25 | 50 | 0.5 | 0.3 | 223 | 249 | Comparative example |
| 236 | 25 | 40 | 35 | 0.5 | 0.3 | 290 | 221 | Present invention |
| 237 | 37.5 | 37.5 | 25 | 0.5 | 0.3 | 327 | 194 | Present invention |
| 238 | 37.5 | 30 | 32.5 | 0.5 | 0.3 | 224 | 173 | Comparative example |
| 239 | 45 | 45 | 10 | 0.5 | 0.3 | 261 | 182 | Present invention |

TABLE 16-continued

| Sam-ple | Composition | | | | | Piezoelectric constant $d_{31}$ | Curie point (°C.) | Remarks |
|---|---|---|---|---|---|---|---|---|
| | a | b | c | X | Y | | | |
| 240 | 50 | 33 | 18 | 0.5 | 0.3 | 258 | 146 | Comparative example |
| 241 | 55 | 40 | 5 | 0.5 | 0.3 | 211 | 142 | Comparative example |
| 242 | 40 | 32 | 28 | 0.5 | 0.3 | 259 | 175 | Present invention |

If the sample Nos. 233 and 234 are compared, it is understood that both of a piezoelectric constant $d_{31}$ and a Curie point are decreased in the sample No. 234 in which the coefficient b is not larger than 32. If the sample Nos. 235 and 236 are compared, it is understood that a piezoelectric constant $d_{31}$ is largely decreased in the sample No. 235 in which the coefficient b is 25. If the sample Nos. 237, 238 and 239 are compared, it is understood that both of a piezoelectric constant $d_{31}$ and a Curie point are decreased in the sample No. 238 in which the coefficient b is not larger than 32. If the sample Nos. 240, 241 and 242 are compared, it is understood that a Curie point is largely decreased as compared with that of the sample No. 242 in the sample No. 240 in which the coefficient a is larger than 45. Moreover, it is understood that both of a piezoelectric constant $d_{31}$ and a Curie point are extraordinarily decreased as compared with that of the sample No. 242 in the sample No. 241 in which the coefficient a is larger than 45 and the coefficient c is smaller than 10.

EXPERIMENT 19

Figure 3:
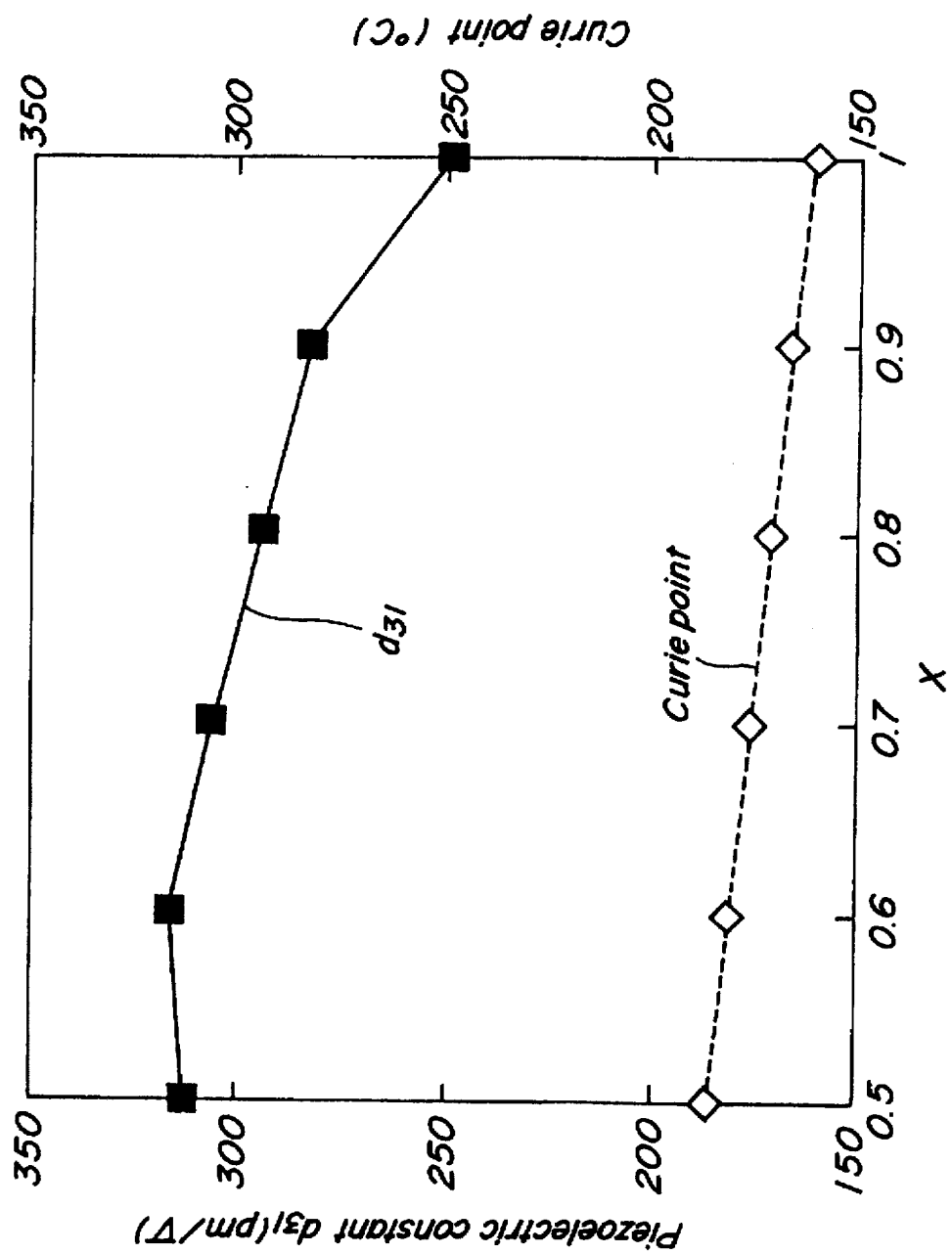
FIG. 3 is a graph depicting a relation between a substitution rate X and a piezoelectric constant $d_{31}$ and a Curie point of a piezoelectric porcelain according to a third aspect of the invention under such a condition that coefficients a, b and c are set in a range within the scope of the third aspect of the invention and a substitution rate X is varied from 0.5 to 1.0 while a substitution rate Y is constant at 0.4.

As is the same as the experiment 16, specimens according to sample Nos. 243~248 in a Table 17 were prepared. With respect to the thus prepared specimens, a piezoelectric constant $d_{31}$ and a Curie point were measured. The measuring results were shown in the Table 17. In the experiment 19, the substitution rate X was varied in a range of 0.5~1.0 while the coefficients a, b and c were maintained constant within the scope of the third aspect of the invention and the substitution rate Y is maintained at 0.4. Moreover, a relation between the substitution rate X and a piezoelectric constant $d_{31}$ or a Curie point is shown in FIG. 3.

TABLE 17

| Sam-ple | Composition | | | | | Piezoelectric constant $d_{31}$ | Curie point (°C.) | Remarks |
|---|---|---|---|---|---|---|---|---|
| | a | b | c | X | Y | | | |
| 243 | 37.5 | 37.5 | 25 | 0.5 | 0.4 | 312 | 186 | Present invention |
| 244 | 37.5 | 37.5 | 25 | 0.6 | 0.4 | 316 | 181 | Present invention |
| 245 | 37.5 | 37.5 | 25 | 0.7 | 0.4 | 306 | 176 | Present invention |
| 246 | 37.5 | 37.5 | 25 | 0.8 | 0.4 | 294 | 171 | Present invention |
| 247 | 37.5 | 37.5 | 25 | 0.9 | 0.4 | 383 | 166 | Present invention |
| 248 | 37.5 | 37.5 | 25 | 1.0 | 0.4 | 250 | 161 | Comparative example |

From the results shown in Table 17, it is understood that a Curie point is extraordinarily decreased to a level of smaller than 170° C. if the substitution rate X is 1.0 Moreover, it is understood that a piezoelectric constant $d_{31}$ is largely improved if the substitution rate X is smaller than 0.9. Further, it is understood that piezoelectric constant $d_{31}$ is more largely improved to a level larger than 300 pm/V if the substitution rate X is smaller than 0.7. Furthermore, it is understood that a piezoelectric constant $d_{31}$ becomes larger than 310 pm/V if the substitution rate X is 0.5 or 0.6.

EXPERIMENT 20

Figure 4:
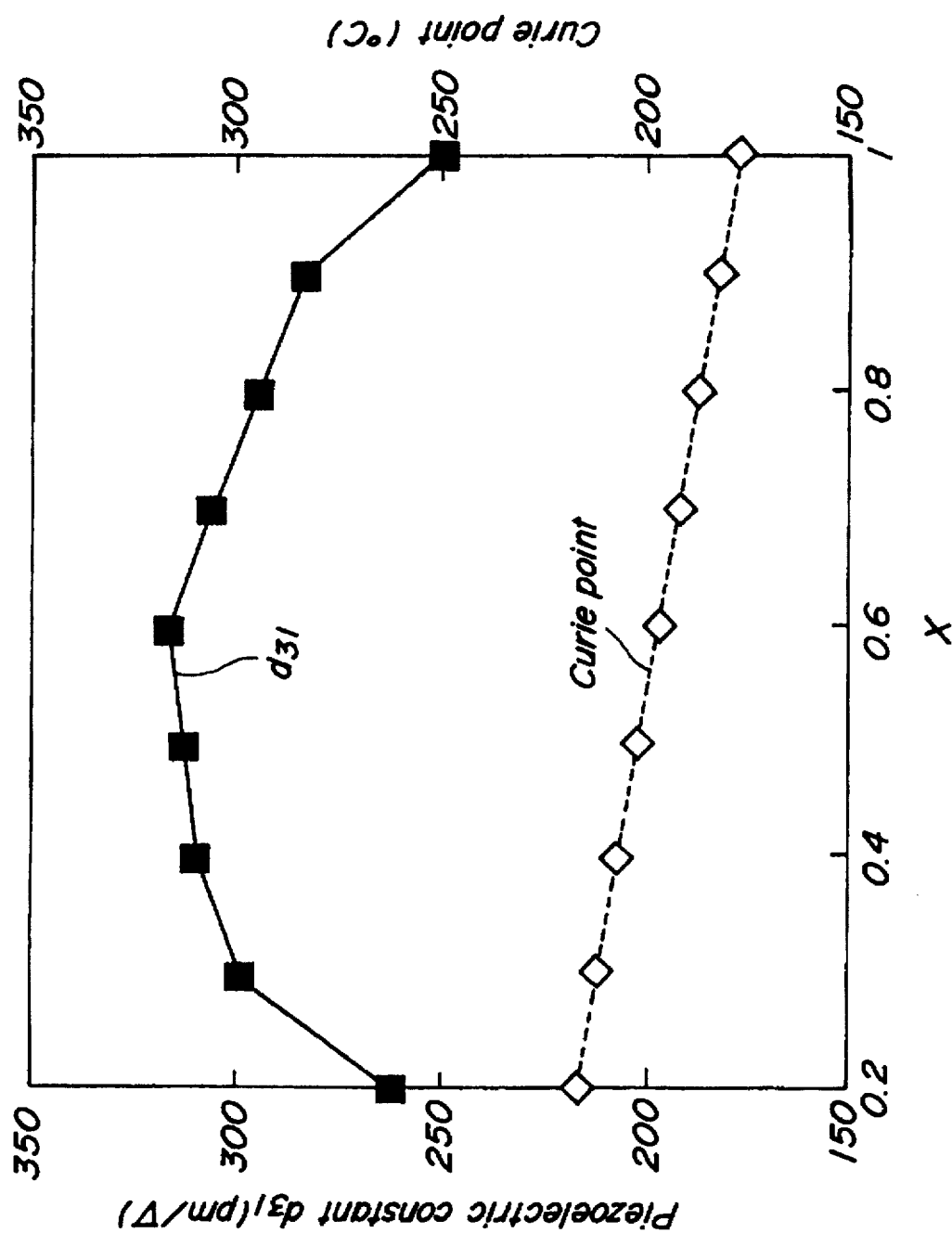
FIG. 4 is a graph showing a relation between the substitution X and a piezoelectric constant $d_{31}$ and a Curie point of the piezoelectric porcelain according to the third aspect of the invention under such a condition that the coefficients a, b and c are set in a range within the scope of the third aspect of the invention and the substitution rate X is varied from 0.2 to 1.0 while a substitution rate Y is constant at 0.2.

In the same manner as experiment 16, specimens according to sample Nos. 249~257 in Table 18 were prepared. With respect to the thus prepared specimens, a piezoelectric constant $d_{31}$ and a Curie point were measured. The measuring results are shown in the Table 18. In the experiment 20, substitution rate X was varied in a range of 0.2~1.0 while the coefficients a, b and c were maintained constant within the scope of the third aspect of the invention and the substitution rate Y is maintained at 0.2. Moreover, a relation between the substitution rate X and a piezoelectric constant $d_{31}$ or a Curie point is shown in FIG. 4.

TABLE 18

| Sam-ple | Composition | | | | | Piezoelectric constant $d_{31}$ | Curie point (°C.) | Remarks |
|---|---|---|---|---|---|---|---|---|
| | a | b | c | X | Y | | | |
| 249 | 37.5 | 37.5 | 25 | 0.2 | 0.2 | 263 | 217 | Comparative example |
| 250 | 37.5 | 37.5 | 25 | 0.3 | 0.2 | 299 | 212 | Present invention |
| 251 | 37.5 | 37.5 | 25 | 0.4 | 0.2 | 309 | 207 | Present invention |
| 252 | 37.5 | 37.5 | 25 | 0.5 | 0.2 | 312 | 202 | Present invention |
| 253 | 37.5 | 37.5 | 25 | 0.6 | 0.2 | 316 | 197 | Present invention |
| 254 | 37.5 | 37.5 | 25 | 0.7 | 0.2 | 306 | 192 | Present invention |
| 255 | 37.5 | 37.5 | 25 | 0.8 | 0.2 | 294 | 187 | Present invention |
| 256 | 37.5 | 37.5 | 25 | 0.9 | 0.2 | 283 | 182 | Present invention |
| 257 | 37.5 | 37.5 | 25 | 1.0 | 0.2 | 250 | 177 | Comparative example |

From the results shown in Table 18, it is understood that a Curie point is extraordinarily decreased if the substitution rate X is 1.0. Moreover, it is understood that a piezoelectric constant $d_{31}$ is largely improved if the substitution rate X is smaller than 0.9. Further, it is understood that a piezoelectric constant $d_{31}$ is largely decreased in the sample No. 249 in which the substitution rate X is equal to the substitution rate Y. Moreover, it is understood that both of a piezoelectric constant $d_{31}$ and a Curie point are largely improved in the sample Nos. 250~256 in which the substitution rate X is larger than the substitution rate Y. Particularly, it is understood that a piezoelectric constant $d_{31}$ is more largely improved to a level larger than 300 pm/V if the substitution rate X is in a range of 0.4~0.7. Moreover, it is understood that a piezoelectric constant $d_{31}$ becomes larger than 310 pm/V if the substitution rate X is 0.5 or 0.6.

EXPERIMENT 21

In the same manner as experiment 16, specimens according to sample Nos. 258~268 in a Table 19 were prepared. With respect to the thus prepared specimens, a piezoelectric constant $d_{31}$ and a Curie point were measured. The measuring results were shown in the Table 19. In this experiment 21, $SrCO_3$ raw material powders were added in the mixed powders and 5 atomic % of Pb was substituted by Sr.

TABLE 19

| Sample | Composition a | b | c | X | Y | Piezoelectric constant $d_{31}$ | Curie point (°C.) | Remarks |
|---|---|---|---|---|---|---|---|---|
| 258 | 10 | 40 | 50 | 0.8 | 0.6 | 237 | 164 | Comparative example |
| 259 | 20 | 40 | 40 | 0.6 | 0.4 | 315 | 162 | Present invention |
| 260 | 20 | 40 | 40 | 1.0 | 0.4 | 256 | 142 | Comparative example |
| 261 | 25 | 50 | 25 | 0.6 | 0.4 | 249 | 176 | Comparative example |
| 262 | 25 | 30 | 45 | 0.8 | 0.1 | 177 | 134 | Comparative example |
| 263 | 37.5 | 47.5 | 15 | 0.6 | 0.4 | 254 | 139 | Comparative example |
| 264 | 37.5 | 37.5 | 25 | 0.2 | 0.0 | 286 | 173 | Comparative example |
| 265 | 37.5 | 37.5 | 25 | 0.4 | 0.2 | 326 | 147 | Present invention |
| 266 | 37.5 | 37.5 | 25 | 0.7 | 0.7 | 347 | 92 | Comparative example |
| 267 | 37.5 | 30 | 32.5 | 0.6 | 0.4 | 247 | 100 | Comparative example |
| 268 | 50 | 35 | 15 | 0.7 | 0.3 | 270 | 83 | Comparative example |

From the results shown in Table 19, if the substitution rate X of nickel with respect to magnesium and the substitution rate Y of tantalum with respect to niobium are within the scope of the third aspect of the invention while the coefficients a, b and c are also within the scope of the third aspect of the invention, it is possible to improve both of a piezoelectric constant $d_{31}$ and a Curie point.

EXPERIMENT 22

As is the same as the experiment 16, specimens according to sample Nos. 269–279 in Table 20 were prepared. With respect to the thus prepared specimens, a piezoelectric constant $d_{31}$ and a Curie point were measured. The measuring results are shown in Table 20. In this experiment 22, $CoCO_3$ raw material powders were added in the mixed powders and 5 atomic % of Pb was substituted by Ca.

TABLE 20

| Sample | Composition a | b | c | X | Y | Piezoelectric constant $d_{31}$ | Curie point (°C.) | Remarks |
|---|---|---|---|---|---|---|---|---|
| 269 | 10 | 40 | 50 | 0.8 | 0.6 | 244 | 154 | Comparative example |
| 270 | 20 | 40 | 40 | 0.6 | 0.4 | 322 | 152 | Present invention |
| 271 | 20 | 40 | 40 | 1.0 | 0.4 | 263 | 132 | Comparative example |
| 272 | 25 | 50 | 25 | 0.6 | 0.4 | 256 | 166 | Comparative example |
| 273 | 25 | 30 | 45 | 0.8 | 0.1 | 183 | 124 | Comparative example |
| 274 | 37.5 | 47.5 | 15 | 0.6 | 0.4 | 261 | 129 | Comparative example |
| 275 | 37.5 | 37.5 | 25 | 0.2 | 0.0 | 293 | 163 | Comparative example |
| 276 | 37.5 | 37.5 | 25 | 0.4 | 0.2 | 333 | 137 | Present invention |
| 277 | 37.5 | 37.5 | 25 | 0.7 | 0.7 | 354 | 82 | Comparative example |
| 278 | 37.5 | 30 | 32.5 | 0.6 | 0.4 | 254 | 90 | Comparative example |
| 279 | 50 | 35 | 15 | 0.7 | 0.3 | 277 | 73 | Comparative example |

From the results shown in the Table 20, if the substitution rate X of nickel with respect to magnesium and the substitution rate Y of tantalum with respect to niobium are within the scope of the third aspect of the invention while the coefficients a, b and c are also within the scope of the third aspect of the invention, it is possible to improve both of a piezoelectric constant $d_{31}$ and a Curie point.

EXPERIMENT 23

In the same manner as experiment 16, specimens according to sample Nos. 280–290 in Table 21 were prepared. With respect to the thus prepared specimens, a piezoelectric constant $d_{31}$ and a Curie point were measured. The measuring results are shown in Table 21. In this experiment 23, $BaCO_3$ raw material powders were added in the mixed powders and 5 atomic % of Pb was substituted by Ba.

TABLE 21

| Sample | Composition a | b | c | X | Y | Piezoelectric constant $d_{31}$ | Curie point (°C.) | Remarks |
|---|---|---|---|---|---|---|---|---|
| 280 | 10 | 40 | 50 | 0.8 | 0.6 | 236 | 169 | Comparative example |
| 281 | 20 | 40 | 40 | 0.6 | 0.4 | 313 | 167 | Present invention |
| 282 | 20 | 40 | 40 | 1.0 | 0.4 | 255 | 147 | Comparative example |
| 283 | 25 | 50 | 25 | 0.6 | 0.4 | 248 | 181 | Comparative example |
| 284 | 25 | 30 | 45 | 0.8 | 0.1 | 176 | 139 | Comparative example |
| 285 | 37.5 | 47.5 | 15 | 0.6 | 0.4 | 253 | 144 | Comparative example |
| 286 | 37.5 | 37.5 | 25 | 0.2 | 0.0 | 285 | 178 | Comparative example |
| 287 | 37.5 | 37.5 | 25 | 0.4 | 0.2 | 324 | 152 | Present invention |
| 288 | 37.5 | 37.5 | 25 | 0.7 | 0.7 | 346 | 97 | Comparative example |
| 289 | 37.5 | 30 | 32.5 | 0.6 | 0.4 | 246 | 105 | Comparative example |
| 290 | 50 | 35 | 15 | 0.7 | 0.3 | 269 | 88 | Comparative example |

From the results shown in the Table 21, if the substitution rate X of nickel with respect to magnesium and the substitution rate Y of tantalum with respect to niobium are within the scope of the third aspect of the invention while the coefficients a, b and c are also within the scope of the third aspect of the invention, it is possible to improve both of a piezoelectric constant $d_{31}$ and a Curie point.

EXPERIMENT 24

In the previous experiments, use was made of oxide powders as raw material powders. In this experiment 24, use was made of hydroxide powders or carbonate powders of metal elements rather than oxide powders, and specimens were prepared in the same manner as the previous experiments. With respect to the specimens, a piezoelectric constant $d_{31}$ and a Curie point were measured. As a result, the specimens according to this experiment 24 have substantially same piezoelectric constant $d_{31}$ and a Curie point as those of the previous experiments.

As mentioned above, according to the third aspect of the invention, a piezoelectric constant $d_{31}$ and a Curie point can be improved extraordinarily.

What is claims is:

1. A piezoelectric porcelain having a composition of $aPb\{Mg_{1/3}(Nb_{1-x}Ta_x)_{2/3}\}O_3$-$bpbTiO_3$-$cPbZrO_3$, coefficients a, b and c being mol % and a+b+c=100, wherein $15 \leq a \leq 45$,
   $32 \leq b \leq 45$,
   $10 \leq c \leq 50$, and
   $0.1 \leq X \leq 0.9$.

2. A piezoelectric porcelain according to claim 1, wherein $25 \leq a \leq 43$,
   $35 \leq b \leq 43$,
   $14 \leq c \leq 40$, and
   $0.3 \leq X \leq 0.8$.

3. A piezoelectric porcelain according to claim 2, wherein $30 \leq a \leq 42$,
   $37 \leq b \leq 40$,
   $18 \leq c \leq 33$, and
   $0.4 \leq X \leq 0.6$.

4. A piezoelectric porcelain according to claim 1, wherein up to 10 atomic % of Pb is substituted by one or more metal elements selected from the group consisting of strontium, calcium and barium.

5. A piezoelectric porcelain according to claim 4, wherein 3~8 atomic % of Pb is substituted by one or more metal elements selected from the group consisting of strontium, calcium and barium.

6. A piezoelectric porcelain according to claim 5, wherein 5~7 atomic % of Pb is substituted by one or more metal elements selected from the group consisting of strontium, calcium and barium.

7. A piezoelectric porcelain having a composition of $aPb\{(Mg_{1-x}Ni_x)_{1/3}(Nb_{1-y}Ta_y)_{2/3}\}O_3$-$bPbTiO_3$-$cPbZrO_3$, coefficients a, b and c being mol % and a+b+c=100, wherein $15 \leq a \leq 45$,
   $32 \leq b \leq 45$,
   $10 \leq c \leq 50$,
   $0.1 \leq X \leq 0.9$,
   $0.1 \leq Y \leq 0.9$, and
   Y-X$\geq$0.05.

8. A piezoelectric porcelain according to claim 7, wherein $25 \leq a \leq 43$,
   $35 \leq b \leq 43$,
   $14 \leq c \leq 40$,
   $0.3 \leq X \leq 0.8$, and
   $0.3 \leq Y \leq 0.8$.

9. A piezoelectric porcelain according to claim 8, wherein $30 \leq a \leq 42$,
   $37 \leq b \leq 40$,
   $18 \leq c \leq 33$,
   $0.4 \leq X \leq 0.6$, and
   $0.4 \leq Y \leq 0.6$.

10. A piezoelectric porcelain according to claim 7, wherein up to 10 atomic % of Pb is substituted by one or more metal elements selected from the group consisting of strontium, calcium and barium.

11. A piezoelectric porcelain according to claim 10, wherein 3~8 atomic % of Pb is substituted by one or more metal elements selected from the group consisting of strontium, calcium and barium.

12. A piezoelectric porcelain according to claim 11, wherein 5~7 atomic % of Pb is substituted by one or more metal elements selected from the group consisting of strontium, calcium and barium.

13. A piezoelectric porcelain having a composition of $aPb\{(Mg_{1-x}Ni_x)_{1/3}(Nb_{1-y}Ta_y)_{2/3}\}O_3$-$bPbTiO_3$-$cPbZrO_3$, coefficients a, b and c being mol % and a+b+c=100, wherein $15 \leq a \leq 45$,
   $32 \leq b \leq 45$,
   $10 \leq c \leq 50$,
   $0.2 \leq X \leq 0.9$,
   $0.2 \leq Y \leq 0.9$, and
   X-Y$\geq$0.05.

14. A piezoelectric porcelain according to claim 13, wherein up to 10 atomic % of Pb is substituted by one or more metal elements selected from the group consisting of strontium, calcium and barium.

15. A piezoelectric porcelain according to claim 14, wherein 3~8 atomic % of Pb is substituted by one or more metal elements selected from the group consisting of strontium, calcium and barium.

16. A piezoelectric porcelain according to claim 15, wherein 5~7 atomic % of Pb is substituted by one or more metal elements selected from the group consisting of strontium, calcium and barium.

* * * * *